United States Patent
Goto

(10) Patent No.: US 10,734,569 B2
(45) Date of Patent: Aug. 4, 2020

(54) ELECTRONIC CIRCUIT AND CALCULATING DEVICE

(71) Applicant: KABUSHIKI KAISHA TOSHIBA, Tokyo (JP)

(72) Inventor: Hayato Goto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/276,650

(22) Filed: Feb. 15, 2019

(65) Prior Publication Data
US 2020/0083423 A1 Mar. 12, 2020

(30) Foreign Application Priority Data
Sep. 12, 2018 (JP) .................................. 2018-170581

(51) Int. Cl.
*H01L 27/18* (2006.01)
*H01L 39/02* (2006.01)
(Continued)

(52) U.S. Cl.
CPC ........... *H01L 39/223* (2013.01); *G06N 10/00* (2019.01); *H01L 27/18* (2013.01); *H01L 39/025* (2013.01)

(58) Field of Classification Search
CPC ....... G06N 10/00; H01L 27/18; H01L 39/025; H01L 39/223
(Continued)

(56) References Cited

U.S. PATENT DOCUMENTS

| | | | |
|---|---|---|---|
| 2006/0097747 A1* | 5/2006 | Amin | G06N 10/00 326/6 |
| 2008/0238531 A1* | 10/2008 | Harris | G06N 10/00 327/528 |

(Continued)

FOREIGN PATENT DOCUMENTS

JP 2017-73106 A 4/2017

OTHER PUBLICATIONS

McKay et al., "Universal Gate for Fixed-Frequency Qubits via a Tunable Bus," Physical Review Applied (2016), 6:064007-1 to 064007-10.

(Continued)

*Primary Examiner* — Duy T Nguyen
(74) *Attorney, Agent, or Firm* — Finnegan, Henderson, Farabow, Garrett & Dunner, L.L.P.

(57) ABSTRACT

According to one embodiment, an electronic circuit includes a superconducting element and a supplier. The superconducting element includes first and second conductive components. The first conductive component includes first and second ends, and a first portion. The first end is capacitively coupled to a first quantum bit having a first characteristic frequency. The second end is capacitively coupled to a second quantum bit having a second characteristic frequency. The first portion is between the first and second ends. The second conductive component includes third end and fourth ends, and a Josephson junction provided between the third and fourth ends. The fourth end is capacitively coupled to the first portion. The supplier supplies a microwave to the third end. The microwave includes one of a first, a second, or a third wave. The second wave includes fourth and fifth waves. The third wave includes sixth and seventh waves.

9 Claims, 2 Drawing Sheets

(51) Int. Cl.
*H01L 39/22* (2006.01)
*G06N 10/00* (2019.01)

(58) Field of Classification Search
USPC .......................................................... 257/31
See application file for complete search history.

(56) References Cited

U.S. PATENT DOCUMENTS

| | | | | |
|---|---|---|---|---|
| 2009/0078932 | A1* | 3/2009 | Amin | G06N 10/00 257/31 |
| 2010/0194466 | A1* | 8/2010 | Yorozu | B82Y 10/00 327/528 |
| 2016/0267032 | A1 | 9/2016 | Rigetti et al. | |
| 2016/0328659 | A1* | 11/2016 | Mohseni | G06N 10/00 |
| 2017/0104493 | A1 | 4/2017 | Goto | |
| 2017/0193388 | A1* | 7/2017 | Filipp | G06N 10/00 |

OTHER PUBLICATIONS

Reagor et al., "Demonstration of universal parametric entangling gates on a multi-qubit lattice," Science Advances (Feb. 2, 2018), 8 pages.
Chen et al., "Qubit, Architecture with High Coherence and Fast Tunable Coupling," Physical Review Letters (Nov. 28, 2014). 113:220502-1 to 220502-5.
Zhao et al., "Two-Photon Driven Kerr Resonator for Quantum Annealing with Three-Dimensional Circuit QED," Physical Review Applied (Aug. 15, 2018), 10:024019-1 to 024019-16.

\* cited by examiner

US 10,734,569 B2

ELECTRONIC CIRCUIT AND CALCULATING DEVICE

CROSS-REFERENCE TO RELATED APPLICATIONS

This application is based upon and claims the benefit of priority from Japanese Patent Application No. 2018-170581, filed on Sep. 12, 2018; the entire contents of which are incorporated herein by reference.

FIELD

Embodiments described herein relate generally to an electronic circuit and a calculating device.

BACKGROUND

For example, a calculating device that includes multiple quantum bits has been proposed. In electronic circuits such as couplers that couple multiple quantum bits and the like, it is desirable for the coupling coefficient of the coupler to be tunable.

DETAILED DESCRIPTION

Figure 1:
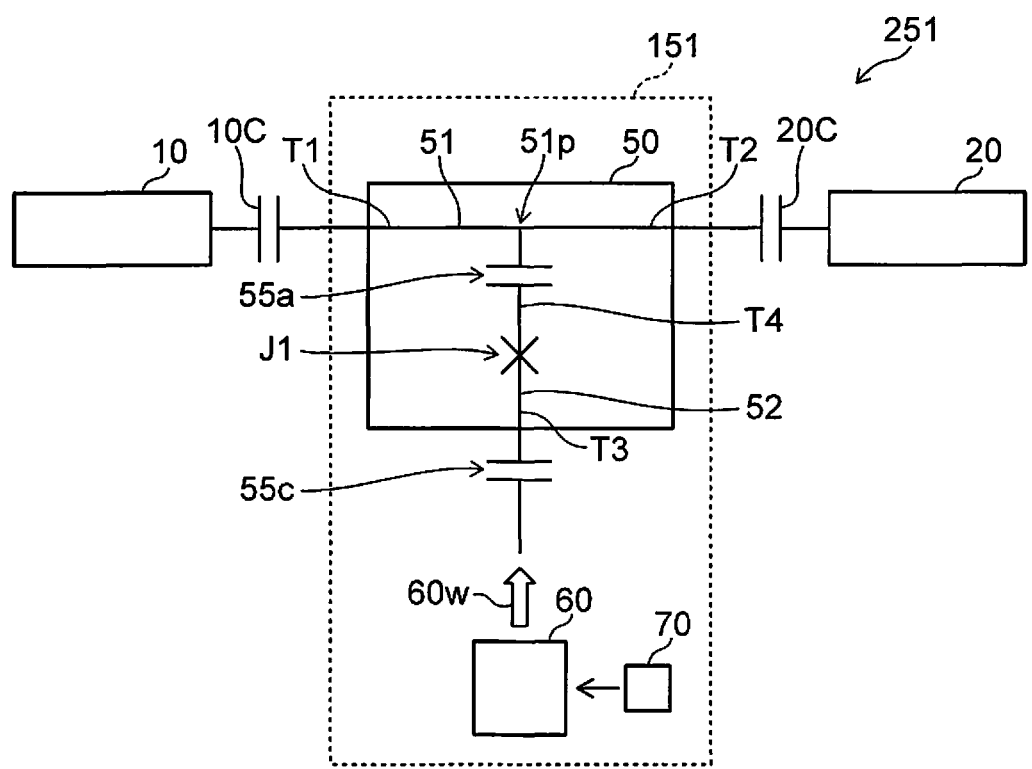
FIG. 1 is a schematic view illustrating an electronic circuit and a calculating device according to a first embodiment.

According to one embodiment, an electronic circuit includes a superconducting element and a supplier. The superconducting element includes a first conductive component and a second conductive component. The first conductive component includes a first end, a second end, and a first portion. The first end is capacitively coupled to a first quantum bit having a first characteristic frequency. The second end is capacitively coupled to a second quantum bit having a second characteristic frequency. The first portion is between the first end and the second end. The second conductive component includes a third end, a fourth end, and a Josephson junction provided between the third end and the fourth end. The fourth end is capacitively coupled to the first portion. The supplier is configured to supply a microwave to the third end. The microwave includes one of a first wave, a second wave, or a third wave. A frequency of the first wave is not less than 0.95 times and not more than 1.05 times ½ of a sum of the first characteristic frequency and the second characteristic frequency. The second wave includes a fourth wave and a fifth wave. A sum of a frequency of the fourth wave and a frequency of the fifth wave is not less than 0.95 times and not more than 1.05 times the sum of the first characteristic frequency and the second characteristic frequency. The third wave includes a sixth wave and a seventh wave. An absolute value of a difference between a frequency of the sixth wave and a frequency of the seventh wave is not less than 0.95 times and not more than 1.05 times an absolute value of a difference between the first characteristic frequency and the second characteristic frequency.

According to another embodiment, a calculating device includes the electronic circuit described above, the first quantum bit, and the second quantum bit.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic view illustrating an electronic circuit and a calculating device according to a first embodiment.

As shown in FIG. 1, the electronic circuit 151 according to the embodiment includes a superconducting element 50 and a supplier 60. In the example, the electronic circuit 151 further includes a controller 70. The controller 70 may be provided separately from the electronic circuit 151.

The calculating device 251 according to the embodiment includes the electronic circuit 151 recited above, a first quantum bit 10, and a second quantum bit 20. The first quantum bit 10 has a first characteristic frequency. The second quantum bit 20 has a second characteristic frequency. The second characteristic frequency is different from the first characteristic frequency.

The superconducting element 50 includes a first conductive component 51 and a second conductive component 52. The first conductive component 51 includes a first end T1, a second end T2, and a first portion 51$p$. The first portion 51$p$ is provided between the first end T1 and the second end T2. The first end T1 is capacitively coupled to the first quantum bit 10 recited above having the first characteristic frequency. The second end T2 is capacitively coupled to the second quantum bit 20 recited above having the second characteristic frequency. The electronic circuit 151 is, for example, a coupler (e.g., a tunable coupler). For example, the first conductive component 51 does not include a Josephson junction. For example, the critical current is sufficiently large between any two points of the first conductive component 51. The critical current is, for example, greater than 0.1 mA. For example, the critical current is sufficiently large between one portion and another one portion of the first conductive component 51. For example, the critical current is sufficiently large between the first end T1 and the second end T2.

The second conductive component 52 includes a third end T3, a fourth end T4, and a Josephson junction 31. The fourth end T4 is capacitively coupled to the first portion 51$p$. For example, an inter-component capacitance 55$a$ is provided between the first portion 51$p$ and the fourth end T4. For example, the superconducting element 50 includes the inter-component capacitance 55$a$. The Josephson junction J1 is provided between the third end T3 and the fourth end T4.

The supplier 60 supplies a microwave 60$w$ to the third end T3. The supplier 60 is, for example, a microwave supplier.

In one example (a first example), the microwave 60$w$ includes a first wave. The frequency of the first wave is substantially equal to the average value of the first characteristic frequency and the second characteristic frequency. The characteristic angular frequency of the first characteristic frequency is taken as a first characteristic angular frequency $\omega 1$. The characteristic angular frequency of the second characteristic frequency is taken as a second characteristic angular frequency $\omega 2$. The angular frequency of the first wave is taken as a first angular frequency $\omega d$. For example, the relationship $\omega d=(\omega 1+\omega 2)/2$ is substantially satisfied.

For example, the frequency of the first wave is not less than 0.95 times and not more than 1.05 times ½ of the sum of the first characteristic frequency and the second characteristic frequency.

In another example (a second example), the microwave 60w includes a second wave. The second wave includes a fourth wave and a fifth wave. The sum of the frequency of the fourth wave and the frequency of the fifth wave is substantially equal to the sum of the first characteristic frequency and the second characteristic frequency. The angular frequency of the fourth wave is taken as a fourth angular frequency $\omega d4$. The angular frequency of the fifth wave is taken as a fifth angular frequency $\omega d5$. For example, the relationship $\omega d4+\omega d5=\omega 1+\omega 2$ is substantially satisfied.

For example, the sum of the frequency of the fourth wave and the frequency of the fifth wave is not less than 0.95 times and not more than 1.05 times the sum of the first characteristic frequency and the second characteristic frequency.

In another example (a third example), the microwave 60w includes a third wave. The third wave includes a sixth wave and a seventh wave. The absolute value of the difference between the frequency of the sixth wave and the frequency of the seventh wave is substantially equal to the absolute value of the difference between the first characteristic frequency and the second characteristic frequency. The angular frequency of the sixth wave is taken as a sixth angular frequency $\omega d6$. The angular frequency of the seventh wave is taken as a seventh angular frequency $\omega d7$. For example, the relationship $\omega d6-\omega d7=\omega 1-\omega 2$ is substantially satisfied. The first characteristic angular frequency $\omega 1$ and the second characteristic angular frequency $\omega 2$ are mutually-interchangeable. The sixth angular frequency $\omega d6$ and the seventh angular frequency $\omega d7$ are mutually-interchangeable.

For example, the absolute value of the difference between the frequency of the sixth wave and the frequency of the seventh wave is not less than 0.95 times and not more than 1.05 times the absolute value of the difference between the first characteristic frequency and the second characteristic frequency.

For example, the microwave 60w includes one of the first to third waves recited above.

The first quantum bit 10 and the second quantum bit 20 which have mutually-different characteristic frequencies can be coupled by such an electronic circuit 151. Because the characteristic frequencies are different, the effects of crosstalk can be suppressed.

The controller 70 controls at least one of an amplitude or a phase of the one of the first to third waves recited above. Thereby, the state of the coupling can be controlled. For example, the strength (e.g., the coupling coefficient) of the coupling can be tuned. For example, the phase of the coupling coefficient can be controlled.

The first end T1 of the superconducting element 50 is capacitively coupled to the first quantum bit 10. The second end T2 is capacitively coupled to the second quantum bit 20. For example, the capacitive coupling between the first end T1 and the first quantum bit 10 is performed by a first coupling capacitance 10C. The capacitive coupling between the second end T2 and the second quantum bit 20 is performed by a second coupling capacitance 20C. The first coupling capacitance 10C and the second coupling capacitance 20C may be included in the electronic circuit 151. These capacitances may be provided separately from the electronic circuit 151.

The third end T3 and the supplier 60 are capacitively coupled. The electronic circuit 151 may further include a third end capacitance 55c (referring to FIG. 1). The third end capacitance 55c is provided between the third end T3 and the supplier 60. The third end capacitance 55c may be included in one of the superconducting element 50 or the supplier 60.

For example, research and development is being conducted for a quantum computer utilizing superconductivity. In one example of a quantum bit included in the quantum computer, for example, the anharmonicity (the nonuniformity of energy level spacing) due to a Josephson junction is utilized; and the ground state and a first excited state are used as the two states of the quantum bit. In such a case, the energy difference between the ground state and the first excited state corresponds to the characteristic frequency of the quantum bit. In another example, two superposition states of the photon number states of a resonator or an oscillator (e.g., two coherent states with opposite phases) are used as the two states of the quantum bit. In such a case, the resonant frequency of the resonator or the oscillation frequency of the oscillator corresponds to the characteristic frequency of the quantum bit.

For such quantum bits, there is a tunable coupler that can tune the coupling strength (the coupling coefficient) of the multiple quantum bits.

For example, it is desirable for the loss of the tunable coupler to be low. In the embodiment, for example, the first conductive component 51 does not include a Josephson junction. For example, the critical current is sufficiently large (e.g., greater than 0.1 mA) between any two points of the first conductive component 51. Thereby, loss that is caused by a Josephson element does not occur in the first conductive component 51. According to the embodiment, a low-loss tunable coupler can be provided.

The electronic elements that are coupled by the electronic circuit 151 according to the embodiment are, for example, quantum bits (the first quantum bit 10, the second quantum bit 20, etc.). Each of the quantum bits has a characteristic frequency (or a characteristic angular frequency). For example, in a quantum bit using the ground state and the first excited state, the frequency of the energy difference between the ground state and the first excited state divided by Planck's constant corresponds to the characteristic frequency of the quantum bit.

In the case where the electronic elements coupled by the electronic circuit 151 are resonators, the resonant frequencies are the characteristic frequencies. In the case where the electronic elements coupled by the electronic circuit 151 are oscillators, the oscillation frequencies are the characteristic frequencies.

The electronic circuit 151 (e.g., the tunable coupler) according to the embodiment can couple the quantum bits (the electronic elements) having different characteristic frequencies. Therefore, the effects of crosstalk can be reduced.

The electronic circuit 151 (e.g., the tunable coupler) according to the embodiment includes the superconducting element 50. The superconducting element 50 includes, for example, a nonlinear microwave element having third-order nonlinearity. The nonlinear microwave element (the superconducting element 50) couples the first quantum bit 10 and the second quantum bit 20 via capacitances (the first coupling capacitance 10C, the second coupling capacitance 20C, etc.).

The nonlinear microwave element (the superconducting element 50) includes a Josephson junction. The third-order nonlinearity is obtained thereby. The microwave 60w recited above is supplied to the nonlinear microwave element via the third end capacitance 55c.

For example, the two quantum bits are coupled by utilizing a four-wave mixing process. For example, the coupling coefficient can be tuned by at least one of the amplitude or the phase of the supplied microwave.

In the embodiment, for example, it is favorable for the inter-component capacitance 55a between the first portion 51p and the fourth end T4 to be larger than the first coupling capacitance 10C between the first end T1 and the first quantum bit 10. For example, it is favorable for the inter-component capacitance 55a to be larger than the second coupling capacitance 20C between the second end T2 and the second quantum bit 20. Thereby, for example, the coupling can be large while suppressing the crosstalk.

For example, the inter-component capacitance 55a is 2 times the first coupling capacitance 10C or more. For example, the inter-component capacitance 55a is 2 times the second coupling capacitance 20C or more.

In the embodiment as described above, the first conductive component 51 does not include a Josephson junction. For example, the critical current between the first end T1 and the second end T2 is sufficiently large (e.g., greater than 0.1 mA).

In the embodiment, the absolute value of the difference between the first characteristic frequency and the second characteristic frequency is, for example, not less than 2 times the absolute value of the coupling coefficient of the capacitive coupling between the first quantum bit and the second quantum bit via the first conductive component 51.

An example of the nonlinear microwave element (the superconducting element 50) will now be described. In the following drawings, the "x" symbol illustrates a Josephson junction. The capacitance between the two ends of the Josephson junction is not illustrated in the following drawings.

Figure 2:
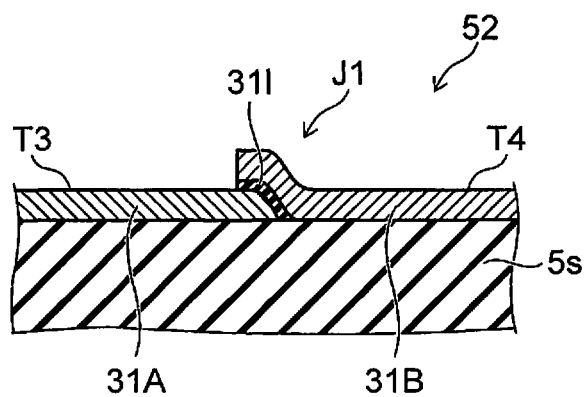
FIG. 2 is a schematic cross-sectional view illustrating a portion of the electronic circuit according to the first embodiment.

FIG. 2 is a schematic cross-sectional view illustrating a portion of the electronic circuit according to the first embodiment.

As shown in FIG. 2, a conductive film 31A, a conductive film 31B, and an insulating film 31I are provided in the second conductive component 52. For example, these films are provided on a substrate 5s. One end of the conductive film 31A is used as the third end T3. One end of the conductive film 31B is used as the fourth end T4. The insulating film 31I is provided between the other end of the conductive film 31A and the other end of the conductive film 31B. The portion that includes the insulating film 31I is used as the Josephson junction J1.

An example of the electronic circuit 151 and the calculating device 251 will now be described.

Figure 3:
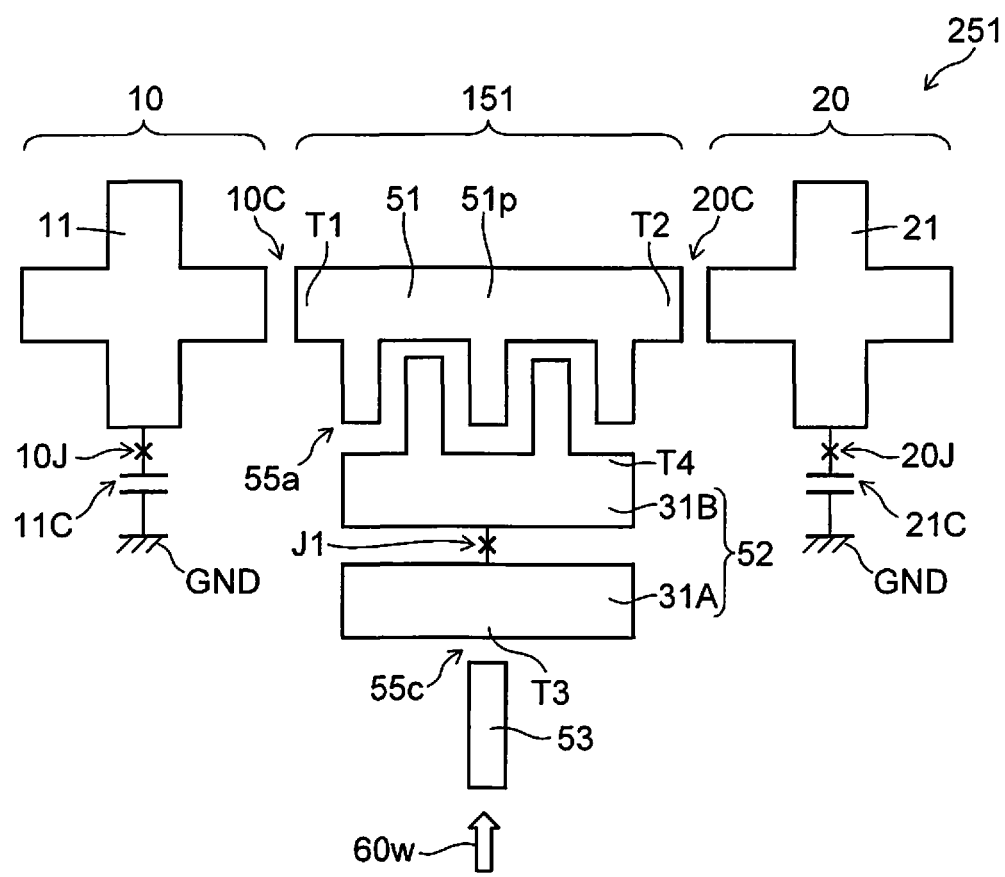
FIG. 3 is a schematic view illustrating the electronic circuit and the calculating device according to the first embodiment.

FIG. 3 is a schematic view illustrating the electronic circuit and the calculating device according to the first embodiment.

As shown in FIG. 3, the electronic circuit 151 includes the superconducting element 50. The supplier 60 is not illustrated in FIG. 3. The first conductive component 51 and the second conductive component 52 are provided in the superconducting element 50. For example, the first portion 51p of the first conductive component 51 and the fourth end T4 of the second conductive component 52 have an interdigital structure. The inter-component capacitance 55a is formed between the first portion 51p and the fourth end T4. The fourth end T4 corresponds to a portion of the conductive film 31B. The third end T3 of the second conductive component 52 corresponds to a portion of the conductive film 31A. The Josephson junction J1 is formed between the conductive film 31A and the conductive film 31B.

A third conductive component 53 is provided in the example. The third end capacitance 55c is formed between the third conductive component 53 and the third end T3. In the example, the microwave 60w is supplied to the third conductive component 53. The microwave 60w is supplied to the third end T3 via the third end capacitance 55c.

For example, the first quantum bit 10 includes a first quantum bit conductor 11 and a Josephson junction 10J. For example, a capacitance 11C is provided between a fixed potential (e.g., a ground potential GND) and the Josephson junction 10J. The Josephson junction 10J is provided between the capacitance 11C and the first quantum bit conductor 11. The first coupling capacitance 10C is provided between the first quantum bit conductor 11 and the first end T1.

For example, the second quantum bit 20 includes a second quantum bit conductor 21 and a Josephson junction 20J. For example, a capacitance 21C is provided between the Josephson junction 20J and a fixed potential (e.g., the ground potential GND). The Josephson junction 20J is provided between the capacitance 21C and the second quantum bit conductor 21. The second coupling capacitance 20C is provided between the second quantum bit conductor 21 and the second end T2.

According to the embodiments, an electronic circuit and a calculating device that are applicable to a coupler having a tunable coupling coefficient can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electronic circuits or oscillators such as superconducting elements, suppliers, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electronic circuits, and calculating devices practicable by an appropriate design modification by one skilled in the art based on the electronic circuits, and calculating devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic circuit, comprising:
    a superconducting element including a first conductive component and a second conductive component, the first conductive component including a first end, a second end, and a first portion, the first end being capacitively coupled to a first quantum bit having a first characteristic frequency, the second end being capacitively coupled to a second quantum bit having a second characteristic frequency, the first portion being between the first end and the second end, the second conductive component including a third end, a fourth end, and a Josephson junction provided between the third end and the fourth end, the fourth end being capacitively coupled to the first portion; and
    a supplier configured to supply a microwave to the third end,
    the microwave including one of a first wave, a second wave, or a third wave,
    a frequency of the first wave being not less than 0.95 times and not more than 1.05 times ½ of a sum of the first characteristic frequency and the second characteristic frequency,
    the second wave including a fourth wave and a fifth wave, a sum of a frequency of the fourth wave and a frequency of the fifth wave being not less than 0.95 times and not more than 1.05 times the sum of the first characteristic frequency and the second characteristic frequency,
    the third wave including a sixth wave and a seventh wave, an absolute value of a difference between a frequency of the sixth wave and a frequency of the seventh wave being not less than 0.95 times and not more than 1.05 times an absolute value of a difference between the first characteristic frequency and the second characteristic frequency.

2. The circuit according to claim 1, wherein the first conductive component does not include a Josephson junction.

3. The circuit according to claim 1, wherein an inter-component capacitance between the first portion and the fourth end is larger than a first coupling capacitance between the first end and the first quantum bit.

4. The circuit according to claim 3, wherein the inter-component capacitance is 2 times the first coupling capacitance or more.

5. The circuit according to claim 3, wherein the inter-component capacitance is larger than a second coupling capacitance between the second end and the second quantum bit.

6. The circuit according to claim 5, wherein the inter-component capacitance is 2 times the second coupling capacitance or more.

7. The circuit according to claim 1, further comprising a third end capacitance provided between the third end and the supplier.

8. The circuit according to claim 1, further comprising a controller controlling at least one of an amplitude or a phase of the one of the first wave, the second wave, or the third wave.

9. A calculating device, comprising:
    the electronic circuit according to claim 1;
    the first quantum bit; and
    the second quantum bit.

* * * * *